United States Patent
Wendelrup et al.

(10) Patent No.: US 6,211,644 B1
(45) Date of Patent: Apr. 3, 2001

(54) METHOD AND APPARATUS FOR IDENTIFYING A BATTERY

(75) Inventors: Heino Wendelrup, Malmö; Michael Kellerman, Åkarp; Johan Mercke; Kristoffer Ptasinski, both of Lund; Jan Rubbmark, Malmö; Jonas Bengtsson, Lund; Charles Forsberg, Skurup, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/491,955

(22) Filed: Jan. 26, 2000

(30) Foreign Application Priority Data

Jan. 27, 1999 (SE) .................................................. 9900309

(51) Int. Cl.[7] ........................................................ H02J 7/00
(52) U.S. Cl. ................................ 320/106; 320/DIG. 12; 702/63
(58) Field of Search .......................... 320/106, DIG. 12; 702/63

(56) References Cited

U.S. PATENT DOCUMENTS

| 5,350,993 | 9/1994 | Toya et al. | 320/2 |
| 5,635,813 | 6/1997 | Shiga et al. | 320/2 |

OTHER PUBLICATIONS

Sandh, H., Internatinal–Type Search Report, Search Request No. SE 99/00116, Nov. 22, 1999, pp. 1–3.

*Primary Examiner*—Peter S. Wong
*Assistant Examiner*—Gregory J. Toatley, Jr.
(74) *Attorney, Agent, or Firm*—Jenkens & Gilchrist A Professional Corporation

(57) ABSTRACT

Method and system for communication between a battery power receiving device and a battery pack are disclosed. The battery power receiving device has a battery information circuit that is carried with the battery power receiving device as a single unit. Battery information such as battery identification and capacity are stored in the battery power receiving device and the battery information circuit. The battery power receiving device uses the battery information if the battery identification stored therein coincides with the battery identification stored in the battery information circuit.

16 Claims, 5 Drawing Sheets

METHOD AND APPARATUS FOR IDENTIFYING A BATTERY

BACKGROUND OF THE INVENTION

This invention relates to a battery system comprising battery means for supplying operating power during battery operation of a battery power receiving device; a battery information circuit carried as a unit with the battery means for assembly with the battery power receiving device; said battery information circuit and said battery power receiving device being capable of communicating mutually, and having means for storing identification information and battery information in the battery information circuit and in the battery power receiving device.

The invention also relates to a method of communication between a battery power receiving device and a battery pack, the battery pack comprising battery means carried as a unit with a battery information circuit, wherein the battery information circuit and the battery power receiving device comprise memory cells for storing battery information and including battery information.

FIELD OF THE INVENTION

The development of cellular telephone technology has created a similar need for development in the area of batteries and battery packs, and more specifically for methods of communicating battery information e.g. in a cellular telephone. The telephones must utilise batteries in order to provide mobile capabilities. The battery is critical to the user of a cellular telephone, since the battery allows the user to move about freely without being tied to a stationary power source.

Thus, in order to fully maximise the use of a cellular telephone, it is important, from a first point of view, that a user achieves maximum performance from an attached battery. This may be achieved by e.g. correctly charging the battery and always being able to identify the exact charging status of the battery. This enables a user to know how much standby time is left on the telephone. This type of information enables a user to intelligently decide whether the charge in the battery is sufficient for their needs or whether charging of the battery is required.

However, from a second point of view and in order to aid the user in achieving such maximum performance from the battery, it is important that the cellular telephone itself is able to achieve maximum performance from an attached battery e.g. by charging and discharging the battery according to given specifications. Such specifications are typically stated as parameters and can comprise minimum and maximum charging and discharging temperatures, maximum charging current and voltage, etc.

Due to the fact that such specifications are battery specific in order to achieve maximum performance, a well-known solution within the field of battery powered equipment is to provide a so-called 'smart' battery or battery system. Such a battery system comprises a battery and a microprocessor or state machine capable of providing battery information to the battery powered equipment e.g. a cellular mobile telephone.

Battery systems used in small-sized hand held electronic equipment especially mobile phones differ from ordinary battery systems in that low weight and hours of use, i.e. time the equipment can be used without having to recharge the battery, are extremely important in the competition with other vendors of mobile telephones and accessories for mobile telephones.

Thus, in order to minimise the cost of manufacture only a small amount of memory is used. Consequently, the battery information stored in the battery pack must be compacted as much as possible. This can be obtained by limiting the battery information stored in the battery pack eg by representing battery parameters with a relatively low resolution.

However, when it comes to storage capacity in the battery powered equipment a relatively great memory capacity is present due to the present advanced circuits for handling the complex functionality of the battery powered equipment. Therefore, the battery powered equipment may contain relatively advanced battery information eg by representing battery parameters with a relatively high resolution.

U.S. Pat. No. 5,350,993 discloses a battery pack selectively connectable to electrical equipment and to a battery charger. The electrical equipment or battery charger decides whether the attached battery pack is a compatible device. If the attached battery is determined to be suitable, electrical power is transferred from the battery pack to the electrical equipment or from the battery charger to the battery pack. The electrical equipment or battery charger receives an electrical signal, from the battery pack, containing battery information by means of which the type of battery pack can be distinguished. Thus, from this patent it is known to determine whether the battery pack is compatible by examining some type of identification information.

However, according to this patent battery information must always be requested from the battery pack when the battery pack has been detached from the electrical equipment. Thus, if battery parameters are represented with a relatively low resolution in the battery pack compared to the resolution in the electrical equipment, an unnecessarily low resolution will be used for judging the current performance of the battery pack.

SUMMARY OF THE INVENTION

A first object of the invention is to provide a battery system which is capable of selecting the best suited battery information.

This is achieved, when the battery system mentioned in the opening paragraph is characterized in that the battery system further comprises means for using the battery information stored in the battery power receiving device as actual battery information, if the identification information stored in the battery information circuit coincides with identification information stored in the battery power receiving device.

Consequently, it is not necessary to communicate battery information from the battery information circuit to the battery power receiving device, if the identification information stored in the battery information circuit coincides with identification information stored in the battery power receiving device. Further, when the battery information, e.g. battery parameters, is represented with a relatively high resolution in the battery power receiving device compared to the resolution in the battery information circuit, a better performance in using the battery means is obtained.

When the battery system further comprises means for detecting subsequent attachments of a battery information circuit or battery information circuits to the battery power receiving device, it is possible to examine whether the identification information coincides as mentioned as above when a battery is attached to the battery receiving device.

This is possible in particular, when the battery system further comprises means for storing the identification information in the battery information circuit and in the battery power receiving device during a first attachment and a second attachment, respectively. Thereby, the examination of whether the identification information coincides as mentioned above only need be examined once during interconnection of the battery and the battery receiving device.

In an expedient embodiment the battery system further comprises means for using the battery information in the battery information circuit as actual battery information if the identification information stored in the battery information circuit does not coincide with identification information stored in the battery power receiving device. Thereby actual battery information can be obtained from the battery information circuit when the battery information in the battery power receiving device is not up to date, i.e. the battery information cannot be used as actual battery information.

When the battery system further comprises means for generating the identification information as random or pseudo random binary code information, the risk of wrongly taking the battery information in the battery power receiving device as actual battery information is minimised.

In an expedient embodiment, the battery system further comprises means for determining whether battery means is identifiable. Thereby it is assured that the type of expected information is correct, and thus the risk of making errors is minimised.

When the battery system further comprises means for determining a protocol of communication between the battery and the battery power receiving device, it is possible to select one out of a number of pre-selected protocols.

In an expedient embodiment, the battery system further comprises means for executing determination of whether battery means is identifiable, determination of a protocol of communication between the battery and the battery power receiving device, and verifying the identification information, by communicating two consecutive times if communication is successful, and communicating maximum three times if communication fails. Consequently, it is possible to further minimise the risk that a battery is identified wrongly, while it is assured that the process of trying to identify the battery is terminated properly.

A second object of the invention is to provide a method of communication between a battery power receiving device and a battery pack, which method is capable of selecting the best suited battery information.

This is achieved, when the method mentioned in the opening paragraphs is characterized in that the method comprises the steps of: storing identification information in the battery information circuit; storing the identification information in the battery power receiving device; using battery information stored in the battery power receiving device as actual battery information, if the identification information stored in the battery information circuit coincides with identification information stored in the battery power receiving device.

Consequently, it is not necessary to communicate battery information from the battery pack to the battery power receiving device, if the identification information stored in the battery pack coincides with identification information stored in the battery power receiving device. Further, when the battery information, e.g. battery parameters, is represented with a relatively high resolution in the battery power receiving device compared to the resolution in the battery pack, a better performance in using the battery means is obtained.

BRIEF DESCRIPTION OF THE DRAWINGS

The invention will be explained more fully below in connection with a preferred embodiment and with reference to the drawing, in which.

DETAILED DESCRIPTION OF THE INVENTION

Figure 1:
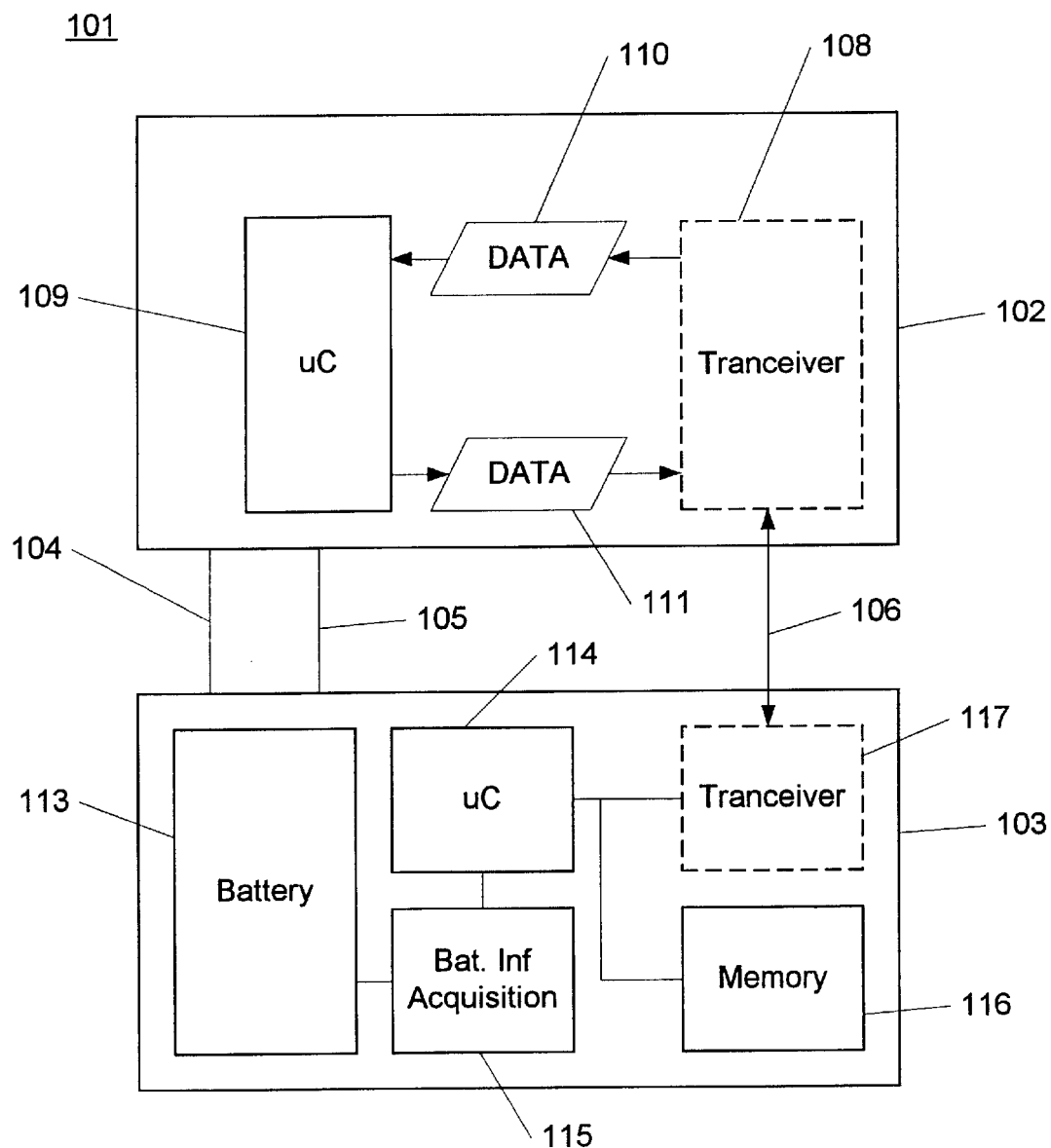
FIG. 1 shows an apparatus according to the invention.

FIG. 1 shows an apparatus 101 comprising an electronic device 102 and a battery or battery pack 103 attached thereto. The apparatus 101 further comprises a number of connections 104, 105, 106 connecting the electronic device 102 and the battery 103 and thus allowing communication between the electronic device 102 and the battery 103.

The electronic device 102 comprises a transceiver 108, which is also called the first communications means in the following, and a micro-controller 109. The transceiver 108 and the micro-controller 109 are adapted to exchange data, which is illustrated by means of the reference sign 110 and 111 in the figure. The micro-controller 109 can transmit information to the transceiver 108 by means of the connection 111. Likewise the connection 110 can be used to transmit data from the transceiver 108 to the micro-controller 109. The transceiver 108 may be a universal asynchronous receiver transmitter (UART).

The battery includes one or more battery cells 113, a micro-controller 114 (which may be a state machine), a battery information acquisition unit 115, a transceiver 117 and a memory 116. It is noted that the transceiver 117 is also called the second communications means in the following. Also the transceiver 117 may be a universal asynchronous receiver transmitter (UART).

The connections 104 and 105 are used to supply power from the battery 103 to the electronic device 102. For example the connector 104 may be connected to the positive pole of the battery cells 113 in the battery 103, and the connector 105 may be connected to a battery negative pole (GND) of the battery cells 113 in the battery 103.

The transceiver 108 included in the electronic device 102 is connected to the transceiver 117 in the battery 103 by means of the connection 106 enabling digital, serial communication comprising transmission of bytes consisting of a number of bits between the first and the second communications means. The memory 116 is adapted to store a number of data information, for example an identification number of the battery, the maximum capacity of the battery, the current capacity of the battery, etc.

The micro-controller 114 is connected to the transceiver 117, to the battery information acquisition unit 115, and to the memory 116. The battery information acquisition unit 115 is connected to the battery cells 113 and is adapted to retrieve battery information, such as the current battery capacity, etc. from the battery cells 113. The battery information acquisition unit 115 is adapted to transmit the information to the micro-controller 114 when instructed to do so by the micro-controller 114. The micro-controller 114 is adapted to store and retrieve the information from the memory 116 and to transmit the information to the electronic device 102 by means of the transceiver 117.

Figure 2:
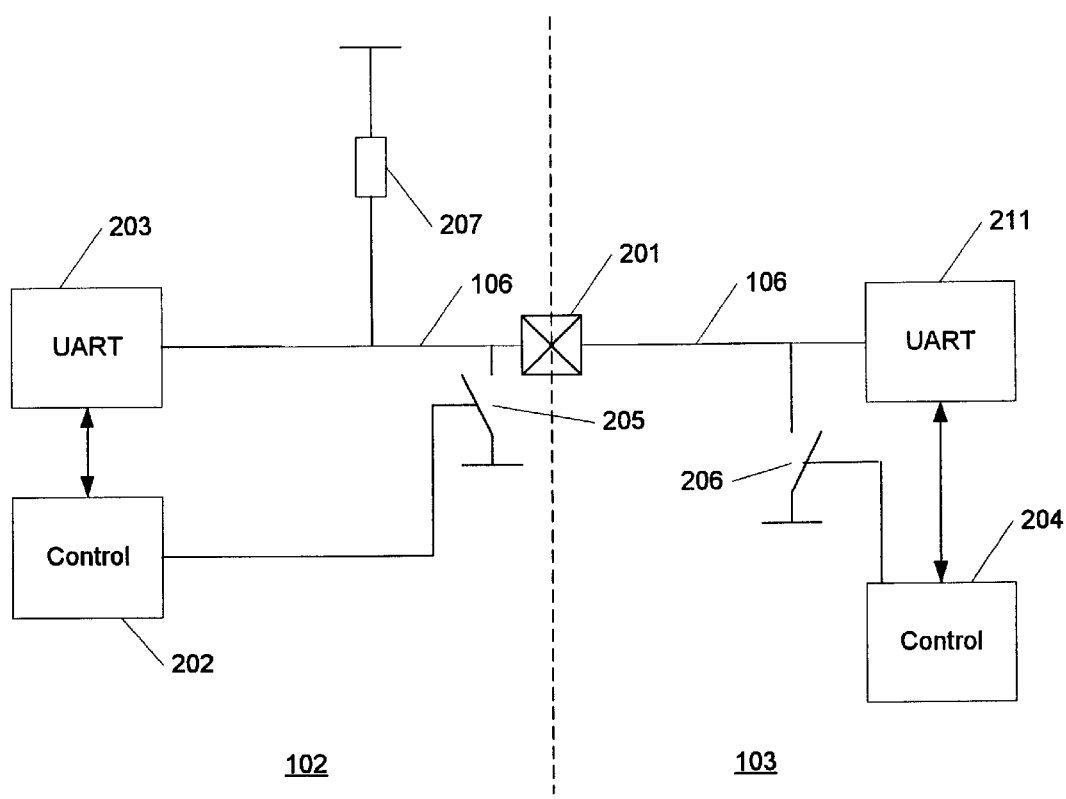
FIG. 2 illustrates a part of an electronic device interfacing with a part of the battery.

FIG. 2 illustrates a part of the electronic device 102 interfacing with a part of the battery 103 and shows the connection 106 adapted to connect the electronic device 102 and the battery 103 in relation to the connection 106 shown in FIG. 1. The left side of FIG. 2 illustrates a part of the electronic device 102 while the right side of FIG. 2 illustrates a part of the battery 103. As shown in the figure, the electronic device 102 and the battery 103 are connected by means of an interface 201.

The electronic device 102 includes a control unit 202 and a universal asynchronous receiver transmitter unit 203, i.e. a so-called UART. Likewise, the battery 103 includes a control unit 204. The electronic device 102 and the battery 103 are adapted to transmit data via the interface 201. The transmission is performed by means of a pull-up resistor 207, a switch 205, and a switch 206. The switch 205 in the electronic device is connected to be controlled by the control unit 202. Likewise, the switch 206 in the battery 103 is connected to be controlled by the control unit 204.

The switch 205 and the switch 206 are both connected to ground potential. This enables the control units 202, 204 to transmit information over the interface 201 in turn. The transmission of information from the electronic device 102 to the battery 103 is controlled by the control unit 202. The control unit 202 is adapted to control the switch 205 and hereby send the information to the battery 103. For example, when the switch 205 is open, the pull-up resistor 207 pulls the potential at the communications line 106 to a high level. On the other hand, when the switch is closed, the potential at the communication line 106 is at a low level. Hereby, by controlling the position of the switch 205 the control unit 202 controls the potential at the communications line 106, and as the communication line is connected to the battery 103 information can be transmitted from the electrical device 102 to the battery 103.

Likewise, the control unit 204 can transmit information from the battery 103 to the electronic device 102 by means of the switch 206. The data generated by the switch 205 in the electronic device 102 are received in a UART 211 which can be similar to the UART 203 in the electronic device 102.

In a preferred embodiment, bytes including a number of bits are transmitted between the electronic device 102 and the battery 103. The format of these bytes is illustrated in FIG. 3.

Figure 3:
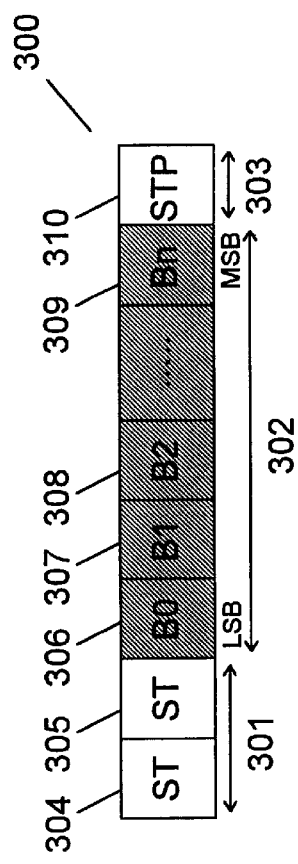
FIG. 3 is an example of a byte to be used in relation to the above mentioned transmission.

FIG. 3 shows an example of a byte consisting of a number of bits which can be used in relation to the above-mentioned transmission. The byte 300 is divided into three sections: a first section 301 including two start bits, a second section 302 including a number of data bits, and a third section 303 including a stop bit.

The first section 301 includes two start bits 304, 305 and is used to indicate the start of the byte 300 during transmission. Preferably, the start bits have different values, e.g. the start bit 304 is a logic "0" while the start bit 305 is a logic "1". The second section 302 includes a number of data bits (for example eight) having values depending on the information being transmitted. The third section 303 includes a stop bit used to indicate the end of the byte. As will become clear from the following, the stop bit is often not necessary, e.g. when the transmitted bytes are separated by periods having a signal level corresponding to the value of the stop bits, or when bytes transmitted have a fixed length.

Figure 4:
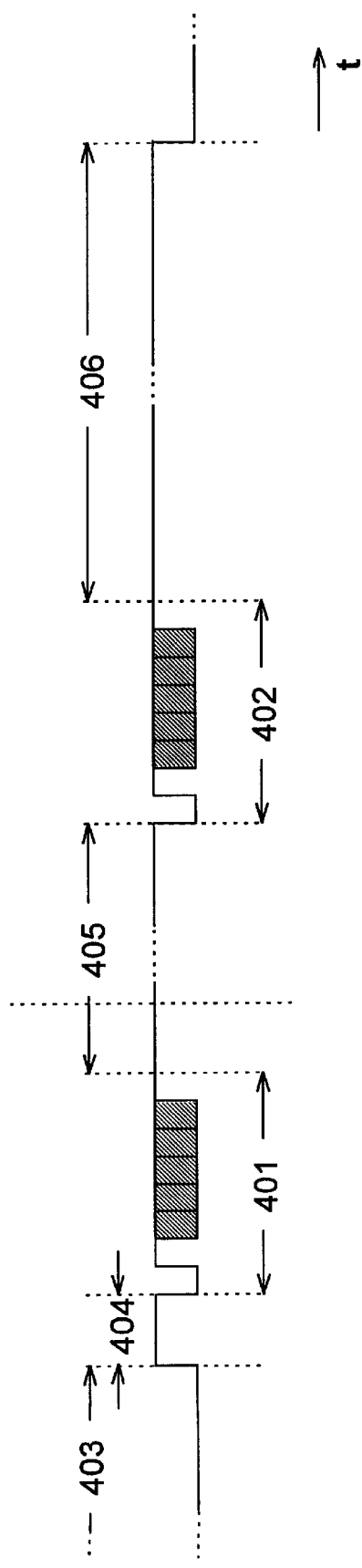
FIG. 4 illustrates the transmission of bytes.

FIG. 4 is a timing diagram illustrating the transmission of bytes over the communications line 106 between the electronic device 102 and the battery 103. Note that the time is increasing from the left to the right in the figure.

The figure shows a first byte 401 being transmitted from electronic device 102 to the battery 103 via the communication line 106 followed by a second byte 402 being transmitted in the reverse direction via the communications line 106, i.e. from the battery 103 to the electronic device 102.

The time intervals illustrating the transmission of the first byte and the transmission of the second byte are separated by a time interval indicated by 405 in the figure. The duration of the time interval 405 is specified by the required response time and minimum set-up time for reversing the direction of communication.

One or more of the electronic means in the battery, e.g. the micro-processor 114 can be in an active state or in a power saving state. In the power saving state the communication line is in a so-called idle state. Hereby, the power consumption of these electronic means can be reduced during periods when no bytes are transmitted between the electronic device 102 and the battery 103.

Prior to the transmission of the first byte the transmission line is in idle state in which the signal level on the transmission line equals a level of logic "0". In the figure the idle period situation is indicated by the reference sign 403. The control unit 202 brings the transmission line into an so-called active state by bringing the signal level on the transmission line 106 to a high level as indicated by the period 404 in the figure. The period 404 is a so-called wake-up period in which one or more of the electronic means in the battery are brought from a power saving state to a normal power consumption state.

As illustrated to the right in the figure, the byte 402 is followed by a an interval 406 in which the signal level at the transmission line 106 equals a level of logic "1", i.e. a situation similar to the situation indicated by the interval 405. The minimum duration of the time interval 406 is specified by the required response time and minimum set-up time for reversing the direction of communication. The interval 406 is followed by a shift from the level of logic "1" to a level of logic "0" indicating a situation in which the transmission line 106 is brought into an idle state. Alternatively, the shift could be indicating the start of a new byte being transmitted, i.e. the shift corresponds to the beginning of a new start bit. It is noted that the transmission line can be brought into an idle state when the duration of the time interval 406 exceeds a given predefined value.

The bytes transmitted via the transmission line 106 can include instructions as well as data. The instructions may include so-called read-only instructions sent by the electronic device 102 and instructing the battery 103 to read specified information from the memory 116 and send the information as one or more data bytes in response. For example, the read-only instruction may instruct the battery to send information on the nominal capacity or the battery serial number. The instruction may also include so-called read/write instructions. For example instructions causing reading or writing the presently remaining capacity of the battery. Further, the instruction set may include instructions causing sending and receiving information of the battery communications bus revision, and causing reading and writing of a dynamic identification number.

The revision information specifies the communications bus revision supported. After exchanging the revision number of the battery communications bus, the micro-controllers 109,114 can use a common communications standard supported by both the electronic device 102 and the battery 103. Hereby, communication between an electronic device 102 and a battery can be obtained even if one of those only supports a later communications standard than the other.

The dynamic identification number is used for communication purposes. The electronic device 102 is adapted to store a given dynamic identification number in both the memory 116 of the battery 103 and in a memory of the electronic device 102. The dynamic identification number may be stored when a battery 103 is connected to the electronic device 102 but can also be stored at an arbitrary time, provided the battery 103 is connected to the electronic device 102.

When the battery is connected to the electronic device 102 the dynamic identification number is transmitted from the battery 103 to the electronic device 102. Hereafter, the dynamic identification number from the battery 103 is compared to one or more dynamic identification numbers stored in the electronic device 102. If the dynamic identification number of the battery does not correspond to a dynamic identification number from the electronic device 102, it means that the battery has been used by other equipment or it may be a completely brand new battery. Therefore, the electronic device 102 does not have current information about the status of the battery, and the electronic device will retrieve information from the battery 102, e.g. information about the presently remaining capacity of the battery 102. If, on the other hand, the dynamic identification number of the battery corresponds to a dynamic identification number from the electronic device 102, the battery has not been used by other equipment, and the electronic device may use information on the battery stored in the electronic device instead of information retrieved from the battery. Whether the information from the electronic device 102 or information from the battery 103 is used depends on other information stored in the battery 103, e.g. information indicating if the battery has been recharged since being disconnected from the electronic device. If this is the case, the mobile phone retrieves the battery capacity from the battery. If this is not the case, the mobile phone uses previously stored internal information on the battery capacity instead. The reason why it is of interest to use internally stored information instead of information from the battery is that the electronic device is normally able to store the information with a higher resolution because of the greater available memory.

It is noted that the electronic device may be a mobile phone or a battery charger. For example, both a mobile phone and a battery charger may perform the above-mentioned reading and writing of dynamic identification numbers and on this basis decide whether to use previously stored information about the battery 103 or alternatively retrieve the information from the battery 103.

Error handling is essentially based upon an echoing mechanism used for commands and data, i.e. retransmission in relation to commands and data. Referring to FIG. 4, the first byte 401 may be transmitted by the electronic device 102 to the battery 103. When the byte 401 is received by the battery 103, the byte is re-transmitted as the byte 402 from the battery 103 to the electronic device 102. When the byte 402 is received in the electronic device 102, the byte 402 is compared with the byte 401 originally sent. If the bytes 401 and 402 do not coincide an error is detected.

In relation to write commands, re-transmission can be carried out in the following way. Firstly, the byte 401 sent by the electronic device 102 is received by the battery 103. Secondly, the received byte is written into a non-volatile memory 116 of the battery 103. Thirdly, the byte is read from the battery non-volatile memory. And finally, the read byte is retransmitted from the battery 103 to the electronic device 102 and the error detection can be performed. Thus it is also checked that the byte was correctly written into the memory 116.

Note, the above mentioned error detection can also be performed on bytes transmitted from the battery 103 to the electronic device 102.

Figure 5:
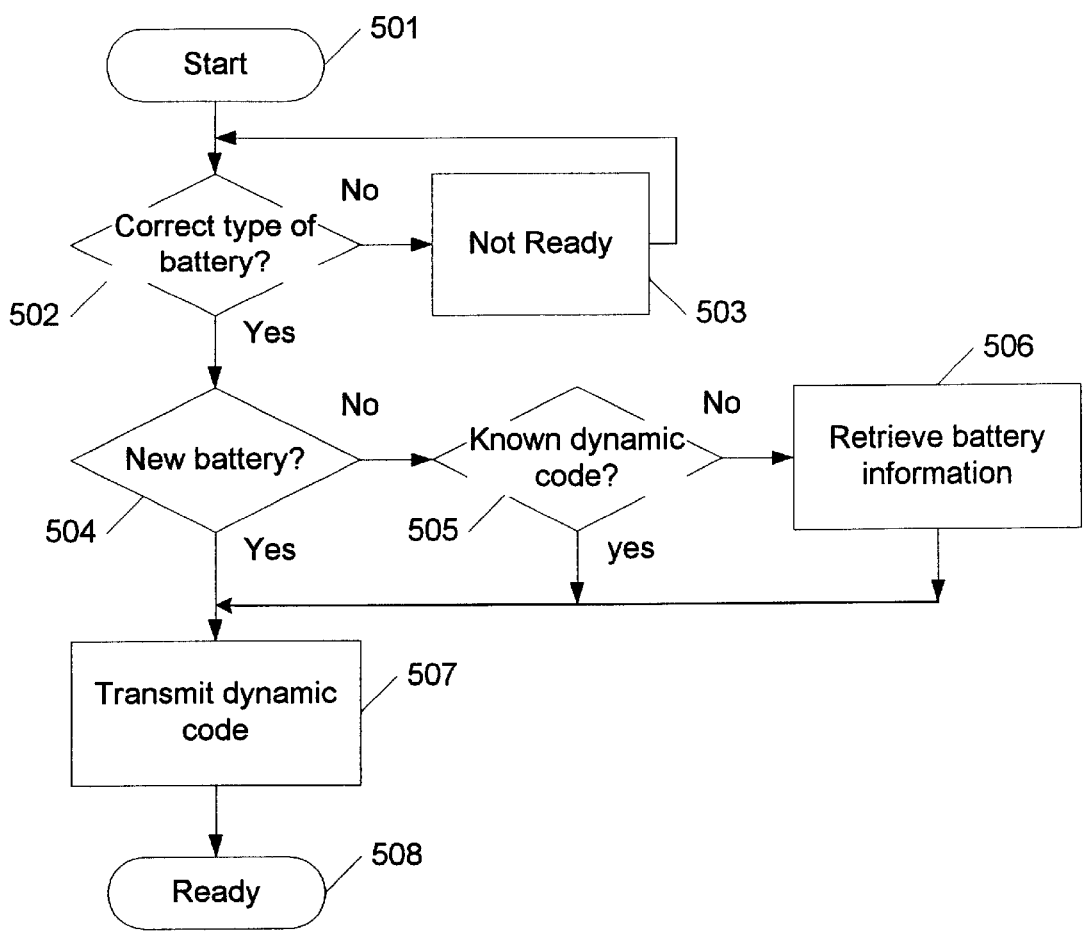
FIG. 5 shows a flowchart for a method of communication between a battery power receiving device and a battery pack.

FIG. 5 shows a flowchart for a method of communication between a battery power receiving device and a battery pack. The method is started in step 501. In step 502 it is determined whether a correct battery or type of battery is attached to the battery power receiving device or electronic device e.g. a mobile telephone. This is carried out by sending a request for identification information to the battery, receiving such identification information and comparing this identification information to identification information previously stored in the electronic device. If the identification information is recognisable the battery is assumed to be a correct type, alternatively, the electronic device is determined to be in a 'not ready' state in step 503 until a recognisable battery is attached.

Assuming the battery is recognisable, the electronic device requests the battery for further identification information in step 504. Further, in step 504, a response to the request is examined. If the response comprises a special code yielding that a new and previously unused battery is attached (Yes), the electronic can use the battery with as a new battery. This comprises that the electronic device can request the battery for battery information or that the electronic device is capable of using previously stored battery information characterising that special type of battery identified as described above. The battery information may comprise the actual charge of the battery and other parameters e.g. being used for charging and de-charging the battery optimally.

In step 507 a so-called dynamic code is transmitted from the electronic device to the battery (i.e. the battery information circuit). This dynamic code is also stored in the electronic device in step 507 for later possible identification of this particular battery.

Alternatively, if it is determined that a new battery is not attached, the response is examined for whether the response comprises a known i.e. a previously stored dynamic code. This is carried out in step 505.

If the result of the examination in step 505 is 'yes' i.e. the response comprises a known dynamic code the method continues in step 507 as described above.

If the result of the examination in step 505 is 'no' i.e. the response comprises an unknown dynamic code, the electronic device determines that it comprises no up to date or actual battery information about the attached battery. Therefore information is retrieved from the battery itself.

If a correct type of battery is identified in step 502, the electronic device will accept the battery and obtain actual battery information either from the electronic device itself or from battery.

During use of the electronic device the electronic device is capable of calculating its own use of battery power and storing that information very precisely compared to a representation the battery. Therefore it is preferred to use the battery information present in the electronic device rather than retrieving the information from the battery.

In a preferred embodiment the step of detecting the correct type of the battery, step 502, is executed when means for detecting attachment of a battery provides a signal.

Further, in a preferred embodiment the dynamic code is stored in the battery information circuit and the electronic device right after the above mentioned signal is provided.

Still further, in a preferred embodiment the dynamic code is generated in step 507 as a random or pseudo-random code.

The flowchart can be implemented as a part of a program in the micro-controller 109.

Figure 6:
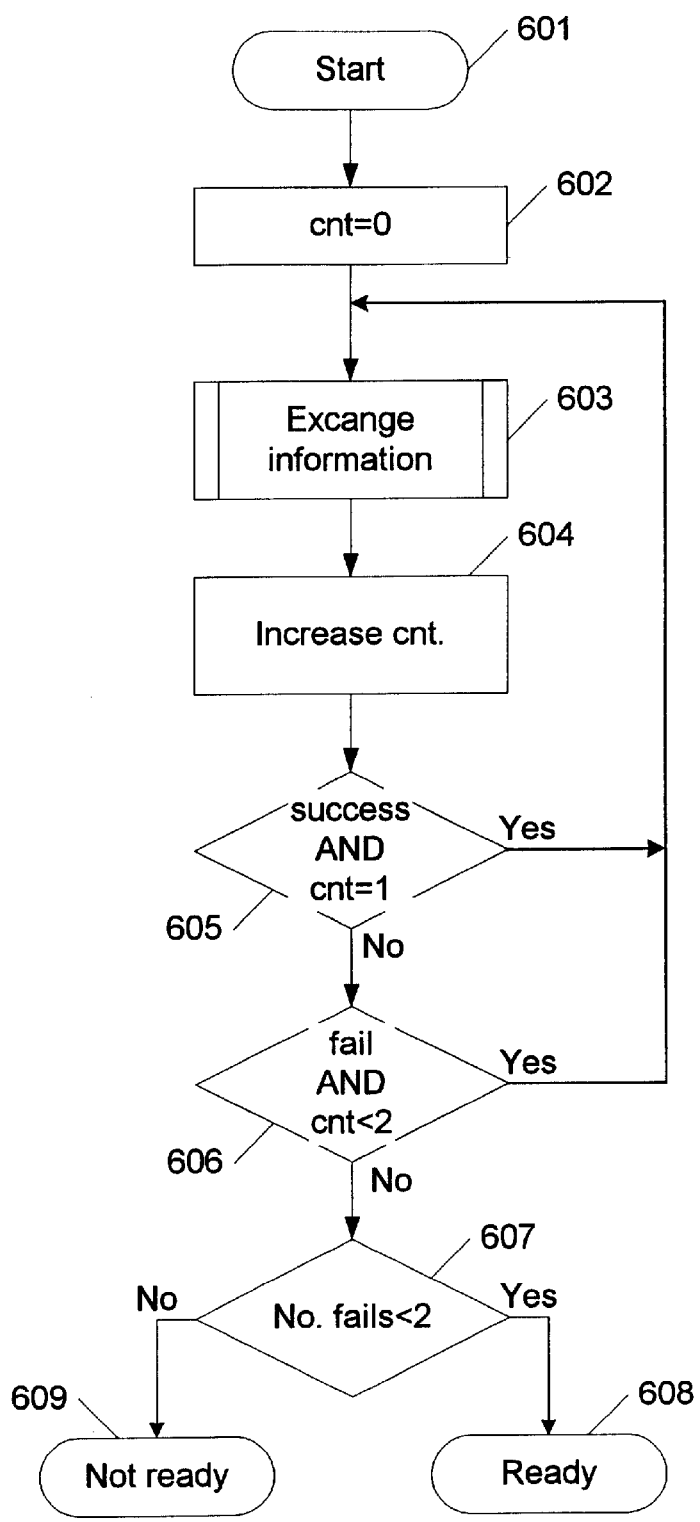
FIG. 6 shows a flowchart for a method of communication by communicating two consecutive times if communication is successful, and communicating maximum three times if communication fails.

FIG. 6 shows a flowchart for a method of communication by communicating two consecutive times if communication is successful, and communicating maximum three times if communication fails. In step 601 the method is started and in step 602 a counter is initialised to zero by setting cnt=0. Step 603 represent that the method is executed three consecutive times with three different sub-methods M1, M2, and M3 executed in step 603, respectively.

Sub-method M1 is a method for ensuring that the electronic device and the battery information circuit use the same protocol of communication.

Sub-method M2 is a method for ensuring that the battery is of a correct or well-known type. This is also known as 'authentificaton'.

Sub-method M2 is a method for ensuring that the dynamic code and thereby the battery is identifiable.

In step 604 the counter cnt is increased by one. Thereafter, in step 605, it is verified whether a sub-method was executed successfully and whether the counter cnt is equal to one, i.e. cnt=1. If both conditions are true, the method resumes in step 603.

Alternatively, in step 606, it is verified whether a sub-method was executed with a fault and whether the counter is less than two, i.e. cnt<2. If both conditions are true, the method resumes in step 603.

In step 607 it is verified whether the number of fails is less than 2. If this is true the electronic device is ready for use in step 608. Alternatively, the device is determined not to be ready. This situation can be handled e.g. by disabling use of the electronic device for a specified time or simply waiting for another battery to be attached.

Although preferred embodiments of the method and apparatus of the present invention have been illustrated in the accompanying drawings and described in the foregoing detailed description, it is understood that the invention is not limited to the embodiments disclosed, but is capable of numerous rearrangements, modifications, and substitutions without departing from the spirit of the invention as set forth by the following claims.

What is claimed is:

1. A battery system, comprising:
   battery means for supplying operating power during battery operation of a battery power receiving device;
   a battery information circuit carried as a unit with the battery means for assembly with the battery power receiving device, said battery information circuit and said battery power receiving device being capable of communicating mutually, and having means for storing identification information and battery information in the battery information circuit and in the battery power receiving device; and
   means for using the battery information stored in the battery power receiving device as actual battery information, if the identification information stored in the battery information circuit coincides with identification information stored in the battery power receiving device.

2. A battery system according to claim 1, wherein the battery system further comprises means for detecting subsequent attachments of a battery information circuit or battery information circuits to the battery power receiving device.

3. A battery system according to claim 2, wherein the battery system further comprises means for storing the identification information in the battery information circuit and in the battery power receiving device during a first attachment and a second attachment, respectively.

4. A battery system according to claim 1, wherein the battery system further comprises means for using the battery information in the battery information circuit as actual battery information, if the identification information stored in the battery information circuit does not coincide with identification information stored in the battery power receiving device.

5. A battery system according to claim 1, wherein the battery system further comprises means for generating the identification information as random or pseudo random binary code information.

6. A battery system according to claim 1, wherein the battery system further comprises means for determining whether battery means is identifiable.

7. A battery system according to claim 1, wherein the battery system further comprises means for determining a protocol of communication between the battery and the battery power receiving device.

8. A battery system according to claim 1, wherein the battery system further comprises means for executing determination of whether battery means is identifiable, determination of a protocol of communication between the battery and the battery power receiving device, and verifying the identification information, by communicating two consecutive times if communication is successful, and communicating maximum three times if communication fails.

9. A method of communication between a battery power receiving device and a battery pack, the battery pack comprising battery means carried as a unit with a battery information circuit, wherein the battery information circuit and the battery power receiving device comprise memory cells for storing battery information including battery identification, the method comprising the steps of:
   storing identification information in the battery information circuit;
   storing the identification information in the battery power receiving device; and
   using battery information stored in the battery power receiving device as actual battery information, if the identification information stored in the battery information circuit coincides with identification information stored in the battery power receiving device.

10. A method according to claim 9, wherein the method further comprises the step of detecting subsequent attachments of a battery information circuit or battery information circuits to the battery power receiving device.

11. A method according to claim 10, wherein the method further comprises the step of storing the identification information in the battery information circuit and in the battery power receiving device during a first attachment and a second attachment, respectively.

12. A method according to claim 9, wherein the method further comprises the step of using the battery information in the battery information circuit as actual battery information, if the identification information stored in the battery information circuit does not coincide with identification information stored in the battery power receiving device.

13. A method according to claim 9, wherein the method further comprises the step of generating the identification information as random or pseudo random binary code information.

14. A method according to claim 9, wherein the method further comprises the step of determining whether battery means is identifiable.

15. A method according to claim 9, wherein the method further comprises the step of determining a protocol of communication between the battery and the battery power receiving device.

16. A method according to claim 9, wherein the method further comprises the steps of executing determination of whether battery means is identifiable, determination of a protocol of communication between the battery and the battery power receiving device, and verifying the identification information, by communicating two consecutive times if communication is successful, and communicating maximum three times if communication fails.

* * * * *